United States Patent
Funakoshi

(10) Patent No.: US 9,146,261 B2
(45) Date of Patent: Sep. 29, 2015

(54) ELECTRONIC DEVICE AND METHOD OF ELECTRONIC DEVICE FOR DETERMINING POWER SOURCE DEVICE

(71) Applicant: Masayuki Funakoshi, Hyogo (JP)

(72) Inventor: Masayuki Funakoshi, Hyogo (JP)

(73) Assignee: RICOH ELECTRONIC DEVICES CO., LTD., Osaka (JP)

( * ) Notice: Subject to any disclaimer, the term of this patent is extended or adjusted under 35 U.S.C. 154(b) by 77 days.

(21) Appl. No.: 14/018,550

(22) Filed: Sep. 5, 2013

(65) Prior Publication Data
US 2014/0070791 A1   Mar. 13, 2014

(30) Foreign Application Priority Data
Sep. 11, 2012   (JP) ................. 2012-199137

(51) Int. Cl.
| | |
|---|---|
| G01R 19/00 | (2006.01) |
| G01R 27/08 | (2006.01) |
| G06F 1/26 | (2006.01) |
| G06F 1/30 | (2006.01) |
| H02J 7/00 | (2006.01) |

(52) U.S. Cl.
CPC ............ *G01R 19/00* (2013.01); *G01R 19/0084* (2013.01); *G01R 19/0092* (2013.01); *G06F 1/263* (2013.01); *G06F 1/30* (2013.01); *G06F 1/305* (2013.01); *H02J 7/0006* (2013.01); *H02J 7/0063* (2013.01); *H02J 2007/0001* (2013.01)

(58) Field of Classification Search
CPC ............... G01R 19/00; G01R 19/0069; G01R 19/0084; G01R 19/0092; G01R 19/165; G01R 1/28; G01R 15/12; G01R 15/144; G01R 15/146; G01R 21/00; G01R 21/06; G01R 31/40; H02J 7/008
USPC .......... 324/76.11, 522, 713, 98; 702/64, 57, 1
See application file for complete search history.

(56) References Cited

U.S. PATENT DOCUMENTS

| | | | |
|---|---|---|---|
| 7,581,119 B2 | 8/2009 | Tupman et al. | |
| 7,839,154 B2* | 11/2010 | Hussain et al. | ............... 324/713 |
| 8,225,114 B2* | 7/2012 | Li et al. | ......................... 713/300 |
| 2008/0272741 A1* | 11/2008 | Kanamori | ..................... 320/137 |
| 2010/0007334 A1* | 1/2010 | Apfel | ....................... 324/123 R |

FOREIGN PATENT DOCUMENTS

| | | |
|---|---|---|
| JP | 2009-247142 | 10/2009 |
| JP | 2010-282633 | 12/2010 |

* cited by examiner

*Primary Examiner* — Hoai-An D Nguyen
(74) *Attorney, Agent, or Firm* — Cooper & Dunham LLP

(57) ABSTRACT

An electronic device includes a current source for applying current, a pull-up resistor or a pull-down resistor configured to be connected to one of a plurality of data terminals, a voltage level detection circuit configured to detect voltage values of the plurality of data terminals, and a connected device determination circuit configured to determine a type of a power source device based on the voltage values of the plurality of data terminals detected by the voltage level detection circuit.

5 Claims, 8 Drawing Sheets

FIG.3

| NAME OF POWER SOURCE DEVICE | R21[kΩ] | R22[kΩ] | R23[kΩ] | R24[kΩ] | POWER SUPPLY CAPABILITY |
|---|---|---|---|---|---|
| POWER SOURCE DEVICE 1 | 75 | 50 | 75 | 50 | 5.0V/0.5A |
| POWER SOURCE DEVICE 2 | 75 | 50 | 43 | 50 | 5.0V/1.0A |
| POWER SOURCE DEVICE 3 | 5 | 10 | 5 | 10 | 5.0V/0.8A |
| POWER SOURCE DEVICE 4 | 33 | 10 | 33 | 10 | 5.0V/2.0A |
| POWER SOURCE DEVICE 5 | OTHER CASE | | | | 5.0V/0.1A |

FIG.4

| NAME OF POWER SOURCE DEVICE | VDP1[V] | VDM1[V] | VDP2[V] | VDM2[V] | POWER SUPPLY CAPABILITY |
|---|---|---|---|---|---|
| POWER SOURCE DEVICE 1 | 2.0 | 2.0 | 2.5 | 0.8 | 5.0V/0.5A |
| POWER SOURCE DEVICE 2 | 2.0 | 2.7 | 2.5 | 1.2 | 5.0V/1.0A |
| POWER SOURCE DEVICE 3 | 3.3 | 3.3 | 3.4 | 2.8 | 5.0V/0.8A |
| POWER SOURCE DEVICE 4 | 1.2 | 1.2 | 1.3 | 0.8 | 5.0V/2.0A |
| POWER SOURCE DEVICE 5 | OTHER CASE | | | | 5.0V/0.1A |

FIG.5

| NAME | BIT | LOGIC | |
|---|---|---|---|
| | | 0 | 1 |
| R_VDP1 /R_VDP2 | 3 | $V_D < 3.0V$ | $3.0V \leqq V_D$ |
| | 2 | $V_D < 2.7V$ | $2.7V \leqq V_D$ |
| R_VDM1 /R_VDM2 | 1 | $V_D < 2.3V$ | $2.3V \leqq V_D$ |
| | 0 | $V_D < 0.6V$ | $0.6V \leqq V_D$ |

* $V_D$: VOLTAGE VALUE OF DATA LINE

FIG.6

| NAME OF POWER SOURCE DEVICE | R_VDP1 | R_VDM1 | R_VDP2 | R_VDM2 | POWER SUPPLY CAPABILITY |
|---|---|---|---|---|---|
| POWER SOURCE DEVICE 1 | 4'h1 | 4'h1 | 4'h3 | 4'h1 | 5.0V/0.5A |
| POWER SOURCE DEVICE 2 | 4'h1 | 4'h3or4'h7 | 4'h3 | 4'h1 | 5.0V/1.0A |
| POWER SOURCE DEVICE 3 | 4'hF | 4'hF | 4'hF | 4'h3or4'h7 | 5.0V/0.8A |
| POWER SOURCE DEVICE 4 | 4'h1 | 4'h1 | 4'h1 | 4'h1 | 5.0V/2.0A |
| POWER SOURCE DEVICE 5 | OTHER CASE | | | | 5.0V/0.1A |

FIG.9

| NAME OF POWER SOURCE DEVICE | VDP1[V] | VDM1[V] | VDP2[V] | VDM2[V] | POWER SUPPLY CAPABILITY |
|---|---|---|---|---|---|
| POWER SOURCE DEVICE 1 | 2.0 | 2.0 | 2.7 | 2.7 | 5.0V/0.5A |
| POWER SOURCE DEVICE 2 | 2.0 | 2.7 | 2.7 | 3.1 | 5.0V/1.0A |
| POWER SOURCE DEVICE 3 | 3.3 | 3.3 | 3.4 | 3.4 | 5.0V/0.8A |
| POWER SOURCE DEVICE 4 | 1.2 | 1.2 | 1.4 | 1.4 | 5.0V/2.0A |
| POWER SOURCE DEVICE 5 | OTHER CASE | | | | 5.0V/0.1A |

FIG.10

| NAME | BIT | LOGIC | |
|---|---|---|---|
| | | 0 | 1 |
| R_VDP1 | 3 | $V_D < 3.0V$ | $3.0V \leqq V_D$ |
| /R_VDP2 | 2 | $V_D < 2.3V$ | $2.3V \leqq V_D$ |
| /R_VDM1 | 1 | $V_D < 1.7V$ | $1.7V \leqq V_D$ |
| /R_VDM2 | 0 | $V_D < 0.6V$ | $0.6V \leqq V_D$ |

* $V_D$: VOLTAGE VALUE OF DATA LINE

FIG.11

| NAME OF POWER SOURCE DEVICE | R_VDP1 | R_VDM1 | R_VDP2 | R_VDM2 | POWER SUPPLY CAPABILITY |
|---|---|---|---|---|---|
| POWER SOURCE DEVICE 1 | 4'h3 | 4'h3 | 4'h7 | 4'h7 | 5.0V/0.5A |
| POWER SOURCE DEVICE 2 | 4'h3 | 4'h7 | 4'h7 | 4'hF | 5.0V/1.0A |
| POWER SOURCE DEVICE 3 | 4'hF | 4'hF | 4'hF | 4'hF | 5.0V/0.8A |
| POWER SOURCE DEVICE 4 | 4'h1 | 4'h1 | 4'h1 | 4'h1 | 5.0V/2.0A |
| POWER SOURCE DEVICE 5 | OTHER CASE | | | | 5.0V/0.1A |

ELECTRONIC DEVICE AND METHOD OF ELECTRONIC DEVICE FOR DETERMINING POWER SOURCE DEVICE

BACKGROUND OF THE INVENTION

1. Field of the Invention

The disclosures herein generally relate to an electronic device that is connected to a power source device that includes a power terminal, a ground terminal, and a plurality of data terminals, and a method of an electronic device for determining a type of the power source device.

2. Description of the Related Art

These days, portable devices powered by a rechargeable secondary battery (for example, portable phones, music players and game devices) are becoming popular. Among the portable devices, those are known that have a USB (Universal Serial Bus) interface and charge the secondary battery using power obtained through the USB interface as described in, for example, patent document 1.

In the case of charging a secondary battery through a USB interface, available power is specified in the USB-IF Battery Charging Specification, and the available power can be determined by performing a specified negotiation process.

These days, however, there is a case where a power level that is specified when operating a portable device is inadequate. And so, in the portable device side, ideas for determining a power level that is provided by a connected power source device have been created. In patent document 2, for example, it is described that a voltage of a data line of a USB interface, to which a power source device is connected, is divided, and that a voltage level that is provided by the power source device is determined from the divided voltage.

RELATED ART DOCUMENT

[Patent document 1] Japanese Patent Application Publication No. 2009-247142
[Patent document 2] Japanese Patent Application Publication No. 2010-282633

SUMMARY OF THE INVENTION

In the related art described above, however, the portable device has to determine the amount of power to be provided from the power source device side only from the voltage of the data terminal being connected to the power source device, and high accuracy is required for the determination.

It is a general object of at least one embodiment of the present invention to provide an electronic device that can determine a type of the connected power source device, and a method of the electronic device for determining a type of the connected power source device, which solves the problems described above.

The following configuration is adopted by embodiments of the present invention in order to achieve the above objective.

The embodiments of present invention disclose an electronic device to be connected to a power source device including a power terminal, a ground terminal and a plurality of data terminals. The electronic device includes a current source for applying current, a pull-up resistor or a pull-down resistor configured to be connected to one of the plurality of data terminals, a voltage level detection circuit configured to detect each of voltage values of the plurality of data terminals, and a connected device determination circuit configured to determine a type of the connected power source device based on the voltage values of the plurality of data terminals detected by the voltage level detection circuit.

Also, the embodiments of present invention disclose a method of an electronic device connected to a power source device for determining the type of the power source device including a power terminal, a ground terminal, a plurality of data terminals, a current source configured to apply current to the plurality of data terminals, a voltage source configured to apply voltage to the plurality of data terminals, and a pull-up resistor or a pull-down resistor configured to be connected to any one of the plurality of data terminals, the method including detecting each of voltage values of the plurality of data terminals, and determining the type of the connected power source device based on the detected voltage values of the plurality of data terminals.

According to the present invention, a type of the connected power source device can be determined.

BRIEF DESCRIPTION OF THE DRAWINGS

Other objects and further features of embodiments will be apparent from the following detailed description when read in conjunction with the accompanying drawings.

FIG. 3 is a drawing illustrating a first example of a capability determination table of the first embodiment.

FIG. 4 is a drawing illustrating a second example of the capability determination table of the first embodiment.

FIG. 5 is a drawing illustrating registers in which determination results of voltage values of the first embodiment are stored.

FIG. 6 is a drawing illustrating a third example of the capability determination table of the first embodiment.

FIG. 9 is a drawing illustrating a first example of a capability determination table of the second embodiment.

FIG. 10 is a drawing illustrating registers in which determination results of voltage values in the second embodiment are stored.

FIG. 11 is a drawing illustrating a second example of a capability determination table of the second embodiment.

DESCRIPTION OF THE PREFERRED EMBODIMENTS

First Embodiment

Figure 1:
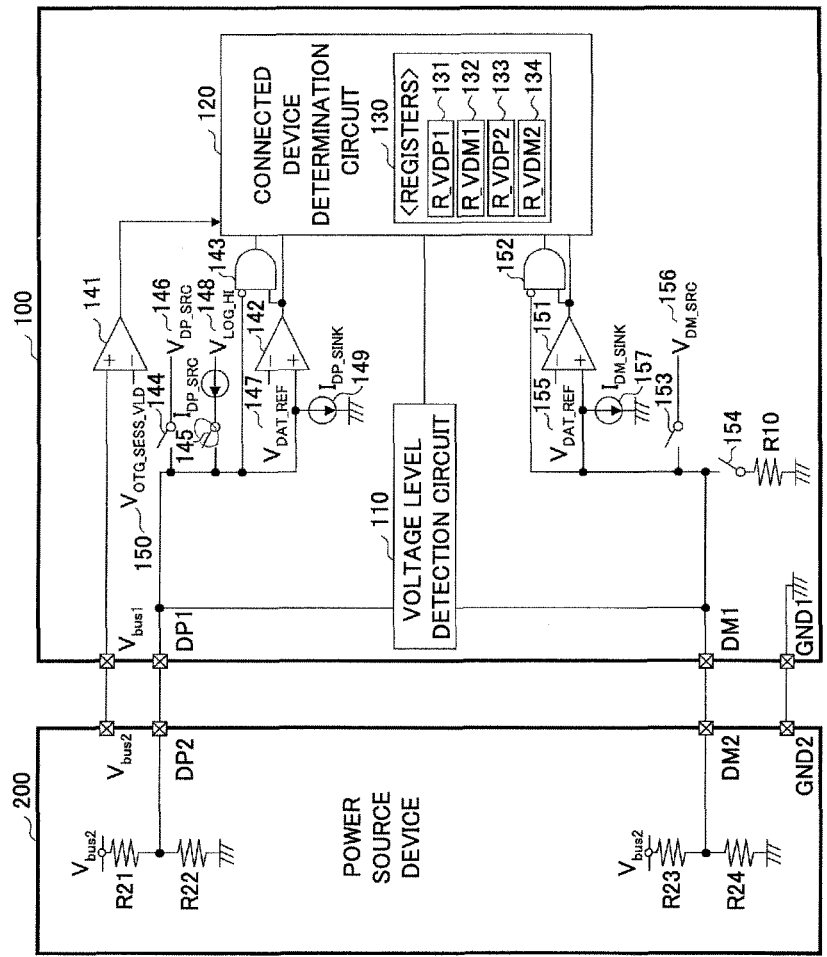
FIG. 1 is a drawing illustrating an electronic device of a first embodiment.

In the following, embodiments of the present invention will be described with reference to the accompanying drawings. FIG. 1 is a drawing illustrating an electronic device 100 of the first embodiment.

The electronic device 100 of the present embodiment, in which a secondary battery (not shown in the figure) is installed, is an electronic device powered by the secondary battery. Regarding the electronic device 100 of the present embodiment, when it is connected to a power source device 200, the secondary battery is charged by power provided by the power source device 200.

The electronic device 100 of the present embodiment includes a voltage level detection circuit 110 and a connected device determination circuit 120. The electronic device 100 of the present embodiment also includes a power terminal $V_{bus1}$ data terminals DP1 and DM1, a ground terminal GND1, comparator circuits 141 and 142, an AND circuit 143, switches 144 and 145, voltage sources 146, 147 and 150, and current sources 146 and 149. The electronic device 100 of the present embodiment further includes a comparator circuit 151, an AND circuit 152, switches 153 and 154, power sources 155 and 156, a current source 157 and a resistor R10.

The power source device 200 of the present embodiment includes resistors R21, R22, R23 and R24. The power source device 200 also includes a power terminal $V_{bus2}$ data terminals DP2 and DM2 and a ground terminal GND2. The resistor R21 is a pull-up resistor of the data terminal DP2, and the resistor R22 is a pull-down resistor of the data terminal DP2. Also, the resistor R23 is a pull-up resistor of the data terminal DM2 and the resistor R24 is a pull-down resistor of the data terminal DM2.

Also, the power terminal $V_{bus2}$ is connected to the power terminal $V_{bus1}$ when the power source device 200 is connected to the electronic device 100. Likewise, the data terminals DP2 and DM2 are connected to the data terminals DP1 and DM1, respectively, and the ground terminal GND2 is connected to the ground terminal GND1.

In the electronic device 100 of the present embodiment, the voltage level detection circuit 110 detects a voltage level (voltage value) of the data terminal DP2 and a voltage level (voltage value) of the data terminal DM2. Also, the connected device determination circuit 120 determines the power source device 200 connected to the electronic device 100. To be more precise, the connected device determination circuit 120 determines whether the power source device 200 connected to the electronic device 100 is a device specified by the USB-IF Battery Charging Specification or not. And the connected device determination circuit 120 identifies the power source device 200 connected to the electronic device 100 and determines a power supply capability of the identified power source device 200.

The voltage level detection circuit 110 of the electronic device 100 is connected between the data terminal DP1 and the data terminal DM1.

The comparator circuit 141 of the electronic device 100 detects whether the power terminal $V_{bus1}$ and the power terminal $V_{bus2}$ are connected or not. Regarding the comparator circuit 141 of the electronic device 100, a non-inverting input terminal is connected to the power terminal $V_{bus1}$ and an inverting input terminal is connected to the voltage source 150. An output of the comparator circuit 141 is provided to the connected device determination circuit 120.

To the data terminal DP1 of the electronic device 100, a non-inverting input terminal of the comparator circuit 142, one input of the AND circuit 143, and ends of the switches 144 and 145 are connected. The non-inverting input terminal of the comparator circuit 142 is further connected to the current source 149, and the inverting input terminal is connected to the voltage source 147. An output of the comparator circuit 142 is provided to the connected device determination circuit 120 and the other input of the AND circuit 143. An output of the AND circuit 143 is connected to the connected device determination circuit 120. The other end of the switch 144 is connected to the voltage source 146 and the other end of the switch 145 is connected to the current source 148.

To the data terminal DM1 of the electronic device 100, a non-inverting input terminal of the comparator circuit 151, one input of the AND circuit 152, and ends of the switches 153 and 154 are connected. The non-inverting input terminal of the comparator circuit 151 is further connected to the current source 157 and the inverting input terminal is connected to the voltage source 155. An output of the comparator circuit 151 is provided to the connected device determination circuit 120 and the other input of the AND circuit 152. An output of the AND circuit 152 is connected to the connected device determination circuit 120. The other end of the switch 153 is connected to the voltage source 156 and the other end of the switch 154 is connected to one end of the resistor R10. The other end of the resistor R10 is grounded.

Figure 2:
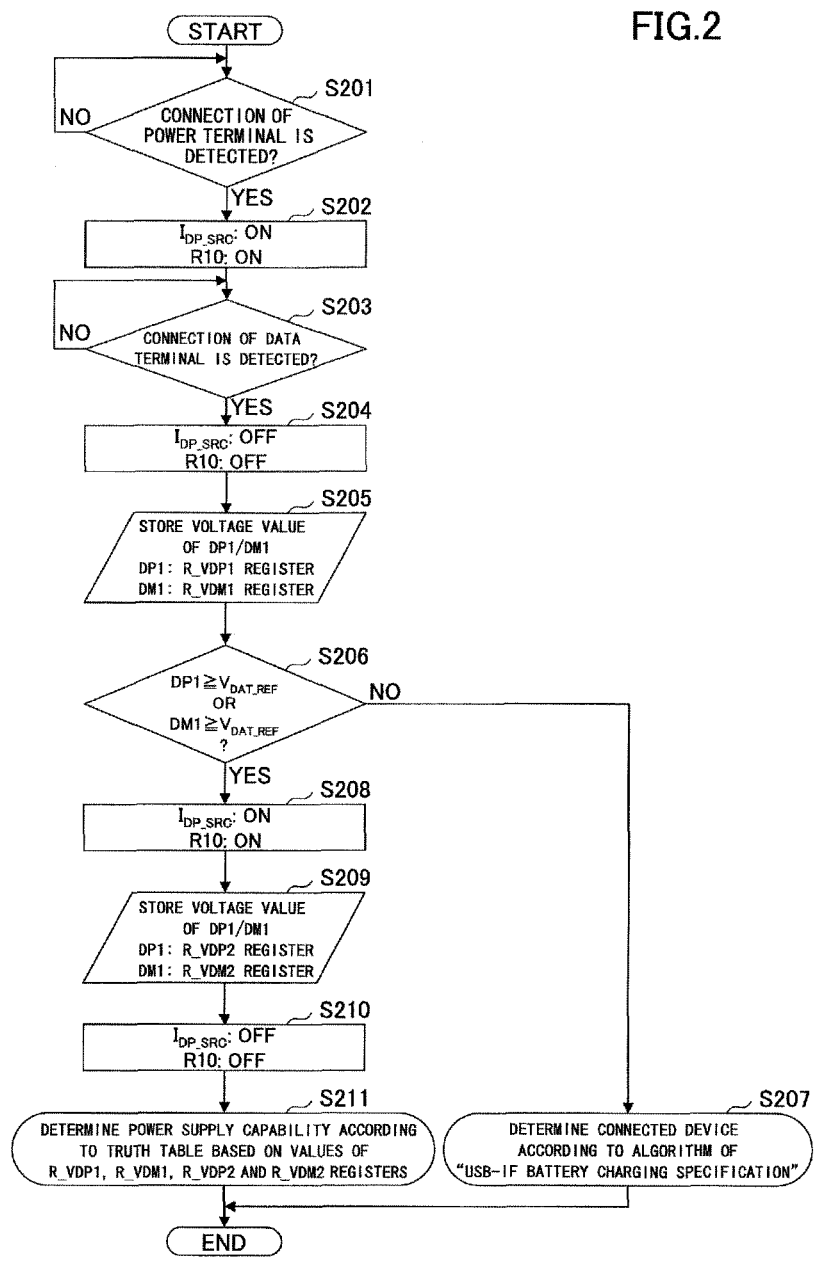
FIG. 2 is a flowchart illustrating operations of the electronic device of the first embodiment.

In the following, referring to FIG. 2, operations of the electronic device 100 will be described. FIG. 2 is a flowchart illustrating the operations of the electronic device 100 of the first embodiment. FIG. 2 illustrates a process of determining the power source device 200 connected to the electronic device 100.

In the present embodiment, the electronic device 100 detects, by using the comparator circuit 141, whether the power terminal $V_{bus1}$ and the power terminal $V_{bus2}$ are connected (step S201). To be more precise, if a voltage of the power terminal $V_{bus1}$ becomes greater than the voltage of the voltage source 150 $V_{OTD\_SESS\_VLD}$ and an output of the comparator circuit 141 is inverted, then the electronic device 100 assumes that an existence of the power terminal $V_{bus2}$ is detected. Determination of the power source device 200 by the connected device determination circuit 120 is started when a connection of the power source device 200 is detected.

In the case where the connection is not detected in step S201, the electronic device 100 for the power terminal $V_{bus2}$ to be connected.

When the connection of the power terminal $V_{bus2}$ is detected in step S201, the switch 145 and the switch 154 are caused to be ON (step S202). Note that in the present embodiment, it is assumed that ON/OFF control of each switch is performed by the connected device determination circuit 120. When the switch 145 is caused to be ON, the data terminal DP1 and the current source 148 are caused to be connected. Also, when the switch 154 is caused to be ON, the pull-down resistor R10 and the data terminal DM1 are caused to be connected.

Then, the connected device determination circuit 120 determines whether the data terminal DP2 and the data terminal DM2 are connected to the electronic device 100 (step S203). In the case where a voltage of the data terminal DP1 is greater than the voltage of the voltage source 147 $V_{DAT\_REF}$ in the comparator circuit 142, it is determined that the data terminal DP2 of the power source device 200 is connected to the data terminal DP1. Also, in the case where a voltage of the data terminal DM1 is greater than the voltage of the voltage source 155 in the comparator circuit 151, it is determined that the data terminal DM2 of the power source device 200 is connected to the data terminal DM1.

In step S203, in the case where the data terminals DP2 and DM2 are not connected, the electronic device 100 waits until the data terminals DP2 and DM2 are connected.

In step S203, when data terminals DP2 and DM2 are connected, the connected device determination circuit 120 causes the switch 145 and the switch 154 to be OFF (step S204). Then the voltage level detection circuit 110 detects a voltage level (voltage value) of the data terminal DP1 and a voltage level (voltage value) of the data terminal DM1 (step S205). The connected device determination circuit 120 stores the voltage values read in step S205 in registers 130. To be more precise, the voltage value of the data terminal DP1 is stored in the R_VDP1 register 131 and the voltage value of the data terminal DM1 is stored in the R_VDM1 register 132.

Then, the connected device determination circuit 120 determines whether the power source device 200, which is connected to the data terminals DP1 and DM1, drives a data line (step S206). That is, the connected device determination circuit 120 determines whether the data lines connected to the data terminals DP1 and DM1 are driven and signals are being provided.

To be more precise, in the present embodiment, in the case where a voltage value of the data terminal DP1 is smaller than the voltage of the voltage source 147 $V_{DAT\_REF}$ in the comparator circuit 142, it is determined that the power source device 200 is not driving the corresponding data line. Also, in the case where the voltage value of the data terminal DP1 is equal to or greater than the voltage of the voltage source 147 $V_{DAT\_REF}$, it is determined that the power source device 200 is driving the corresponding data line.

Likewise, in the case where a voltage value of the data terminal DM1 is smaller than the voltage of the voltage source 155 $V_{DAT\_REF}$ in the comparator circuit 151, it is determined that the power source device 200 is not driving the corresponding data line. Also, in the case where the voltage value of the data terminal DM1 is equal to or greater than the voltage of the voltage source 155 $V_{DAT\_REF}$, it is determined that the power source device 200 is driving the corresponding data line.

In step S206, in the case where it is determined that no data line is driven, the connected device determination circuit 120 determines that the power source device 200 is a type of device that is specified by the USB-IF Battery Charging Specification (a Standard Downstream Port, a Charging Downstream Port, a Dedicated Charging Port, etc.) Therefore, the connected device determination circuit 120 performs a process for determining a type of power source device 200 according to the algorithm specified in the USB-IF Battery Charging Specification (step S207), and ends the process.

In step S206, in the case where it is determined that the data line is driven, the connected device determination circuit 120 can determine that the type of the connected power source device 200 is other than the device specified by the USB-IF Battery Charging Specification. Therefore, the connected device determination circuit 120 does not perform the algorithm specified by the USB-IF Battery Charging Specification, and moves to processes of step S208 and thereafter for determining voltage-dividing resistors of the power source device 200 side that are driving the data line.

The electronic device 100 of the present embodiment, in the sequence of determining the voltage dividing resistors, causes the switch 145 and the switch 154 to be ON (step S208). Subsequently, the voltage level detection circuit 110 detects the voltage value of the data terminal DP1 and the voltage value of the data terminal. DM1 (step S209). Subsequently, the electronic device 100 stores the voltage values read in the registers 130. To be more precise, the voltage value of the data terminal DP1 is stored in the R_VDP2 register 133 and the voltage value of the data terminal DM1 is stored in the R_VDM2 register 134.

Subsequently, the connected device determination circuit 120 causes the switch 145 and the switch 154 to be OFF (step S210). Subsequently, the connected device determination circuit 120 performs a process for determining a power supply capability of the connected power source device 200 based on the voltage values stored in the registers 130 in step S205 and step S209 (step S211). Details of a process of step S211 will be described later.

In the following, determination of the power supply capability of the power source device 200 by the connected device determination circuit 120 of the present embodiment is described. There are two methods for determining the power supply capability of the power source device 200.

The first method is a method in which resistances of a pull-up resistor and a pull-down resistor connected to the data terminal DP1 and the data terminal DM1 are calculated based on the voltage values stored in the registers 130, and the result of calculation is compared with a truth table.

Because any resistor can be measured with this method, even those cases can be handled in which power source devices with a pull-up resistor or a pull-down resistor that did not exist in the market at the time of the product development come into the market later, by maintaining the truth table by software and by updating the software.

Also, in this method, because any voltage range needs to be measured, it is preferable that the voltage level detection circuit 110 includes an A/D (Analog/Digital) converter circuit, etc.

In this method, in order to obtain resistor values, a system of equations of the pull-up resistor and the pull-down resistor of the data lines DP2 and DM2 are established and solved. In the electronic device 100 of the present embodiment, the system of equations includes an equation for a state in which the voltage or the current is not applied and an equation for a state in which the current is applied to the data terminal DP1 and the pull-down resistor R10 is connected to the data terminal DM1.

In the present embodiment, theoretical values of the R_VDP1 register 131 and the R_VDP2 register 133 (VDP1 and VDP2) are determined by the following formula 1 and formula 2.

⟨Math 1⟩

$$VDP1 = \frac{V_{bus2} \times R22}{R21 + R22} \quad \text{formula 1}$$

⟨Math 2⟩

$$VDP2 = R22\left(\frac{V_{bus2}}{R21 + R22} + I_{DP\_SRC}\right) \quad \text{formula 2}$$

In the present embodiment, by solving these formulas as a system of equations, a resistor value of the resistor R21, which is a pull-up resistor of the internal data terminal DP2 of the power source device 200, and a resistor value of the resistor R22, which is a pull-down resistor, can be obtained. The resistor R21 and the resistor R22 can be obtained by the following formula 3 and formula 4.

⟨Math 3⟩

$$R21 = \frac{(V_{bus2} - VDP1)(VDP2 - VDP1)}{VDP1 + I_{DP\_SRC}} \quad \text{formula 3}$$

⟨Math 4⟩

$$R22 = \frac{VDP2 - VDP1}{I_{DP\_SRC}} \quad \text{formula 4}$$

Likewise, in the present embodiment, theoretical values of the R_VDM1 register 132 and the R_VDM2 register 134 (VDM1 and VDM2) are determined by the following formula 5 and formula 6.

⟨Math 5⟩

$$VDM1 = \frac{V_{bus2} \times R24}{R23 + R24} \quad \text{formula 5}$$

⟨Math 6⟩

$$VDM2 = \frac{V_{bus2} \times (R24 // R10)}{R23 + (R24 // R10)} \quad \text{formula 6}$$

In the present embodiment, by solving these formulas as a system of equations, a resistor value of the resistor R23, which is a pull-up resistor of the internal data terminal DM2 of the power source device 200, and a resistor value of the resistor R24, which is a pull-down resistor, can be obtained. The resistor R23 and the resistor R24 can be obtained by the following formula 7 and formula 8.

⟨Math 7⟩

$$R23 = \frac{V_{bus2}^2 \times R10 \times (VDM1 - VDM2)(1 - VDM1)}{VDM1 \times VDM2 \times (V_{bus} - VDM1)} \quad \text{formula 7}$$

⟨Math 8⟩

$$R24 = \frac{V_{bus2} \times R10 \times (VDM1 - VDM2)}{VDM2 \times (V_{bus2} - VDM1)} \quad \text{formula 8}$$

The connected device determination circuit 120 of the present embodiment, using the resistor values obtained as described above, and comparing with a capability determination table for determining power supply capability of the power source device 200, determines the power supply capability.

FIG. 3 is a drawing illustrating a first example of the capability determination table of the first embodiment. In the capability determination table 30 shown in FIG. 3, a power source device name is associated with a resistor value of the pull-up resistor R21 of the power source device 200 side connected to the data terminal DP2, a resistor value of the pull-down resistor R22, a resistor value of the pull-up resistor R23 of the power source device 200 side connected to the data terminal DM2, a resistor value of the pull-down resistor R24, and the power supply capability of the power source device. The capability determination table 30 of the present embodiment may be, for example, stored beforehand in a memory unit, not shown in the figure, included in the connected device determination circuit 120 or may be stored in a memory unit, not shown in the figure, included in the electronic device 100.

Next, the second method for determining the power supply capability of the power source device 200 will be described.

In the present embodiment, the second method is a method for determining the power supply capability in the case where the resistor value of the pull-up resistor of the connected power source device 200 and the resistor value of the pull-down resistor are known. In this case, theoretical values (voltage values) of the R_VDP1 register 131, the R_VDM1 register 132, the R_VDP2 register 133 and the R_VDM2 register 134 can be calculated. Therefore, one has only to determine whether measured voltages are within a predefined voltage range or not.

In this case, the voltage level detection circuit 110 only has to include a circuit such as a comparator, etc.

In this method, however, in the case where power source devices with a pull-up resistor or a pull-down resistor that did not exist in the market at the time of the product development come into the market later, it is possible to make a wrong detection or to end up being unable to determine. In such a case, one only has to use a capability determination table in which the pull-up resistor and the pull-down resistor are replaced by voltage values of the data terminal DP1 and DM1.

FIG. 4 is a drawing illustrating a second example of the capability determination table 40 of the first embodiment. In the capability determination table 40 shown in FIG. 4, a case is shown in which the pull-up resistor and the pull-down resistor are replaced by voltage values of the data terminals. Also, in the capability determination table 40 shown in FIG. 4, it is assumed that, for example, the power terminal $V_{bus1}$=5.0 V, the current value of the current source 148=10 uA, and a resistor value of the resistor R10=19 kΩ. In the case of determining the power source devices 1 through 5 using the capability determination table 40, one only has to determine whether the voltage values of the data lines are higher or lower compared to, for example, four threshold values (0.6 V, 2.3 V, 2.7 V and 3.0 V) and to store the determination results in the registers 130. Note that the threshold values may be set beforehand. FIG. 5 is a drawing illustrating examples of registers in which determination results of voltage values are stored. Taking an error of +/−0.1 V of the detected voltage value into account, expected register values become as shown in FIG. 6.

FIG. 6 is a drawing illustrating a third example of a capability determination table 60 of the first embodiment. In the capability determination table 60 shown in FIG. 6, register values are associated with the power supply capability. Also, in the capability determination table 60 shown in FIG. 6, a name of the power source device is associated with the values stored in the registers 130 and the power supply capability. The electronic device 100 can determine the power supply capability of the power source device 200 based on the values stored in the registers 130 in step S205 and step S209 and the capability determination table 60.

Next, how to use the power supply capability determined by the electronic device 100 of the present embodiment will be described.

For example, in the case where the electronic device 100 includes a power management unit for managing power, the electronic device 100 can manage power consumption based on the determined power supply capability of the power source device 200. Also, the electronic device 100 can provide a secondary battery, etc., with power based on the power supply capability of the power source device 200.

In the electronic device 100, the power supplied by the power source device 200 and consumed in the supplied power consumption unit (power consumption) can be set by software, etc., according to the characteristics of the supplied power consumption unit. This setting can be done by a user.

Also, in the case where, for example, a voltage level of the secondary battery becomes less than the operable voltage level, power to be consumed by the electronic device 100 may be set autonomously by itself, and the consumption power can be set by a user after the voltage level of the secondary battery exceeds the operable voltage level.

As described above, in the electronic device 100 of the present embodiment, it can be determined whether the connected power source device 200 is a type of power source device that conforms to the specification of the USB-IF Battery Charging Specification. Also, the power source device 200 connected to the electronic device 100 drives the data lines using voltages divided by resistors. Therefore, in the case, for example, where the power source device 200 is a power source device from which greater power than those defined by the USB-IF Battery Charging Specification is available, the power supply capability of the connected power source device 200 can be determined by reading the state of the data lines.

Also, in the present embodiment, by detecting the resistor value of the pull-down resistor connected to the data line DM1, the type of the connected power source device 200 can be determined. With this configuration, the voltage of the data terminal DM1 can be detected even in the case where the voltage of the data terminal DM1 is greater than the voltage of the voltage source 155 as a reference voltage of the comparator circuit.

Furthermore, in the present embodiment, the configuration of the electronic device 100 can be simplified because the power supply capability of the power source device 200 is determined by using configuration elements (applying voltage to a data line, applying current to a data line, connecting a pull-up resistor to a data line, and connecting a pull-down resistor to a data line) needed for the USB-IF Battery Charging Specification. The configuration elements needed for the USB-IF Battery Charging Specification are applying voltage to the data terminals DP1 and DM1, applying current between the data terminals DP1 and DM1, and connecting a pull-up resistor or a pull-down resistor to the data terminals DP1 and DM1.

Also, in the case where the electronic device 100 includes a power management unit, because the power used by the electronic device 100 side can be set, the power supply capability of the power source device 200 can be utilized to the maximum extent. Also, the electronic device 100 can be safely operated by not consuming the power beyond the capability of the power source device 200.

Also, by having the power consumption autonomously set by the electronic device 100, the power can be set according to the purpose of the usage even in the case where, for example, there is no means for transferring a user command to the electronic device 100.

Second Embodiment

In the following, a second embodiment of the present invention will be described referring to the accompanying drawings. In the second embodiment of the present invention, a point different from those of the first embodiment is that the power source device 200 is determined by connecting pull-up resistors to the data terminals D21 and DM1. Therefore, in the description of the second embodiment of the present embodiment below, only the point different from those of the first embodiment will be described, the same referral numbers will be used for configuration elements that have the same functions as in the first embodiment, and the descriptions for them will be omitted.

Figure 7:
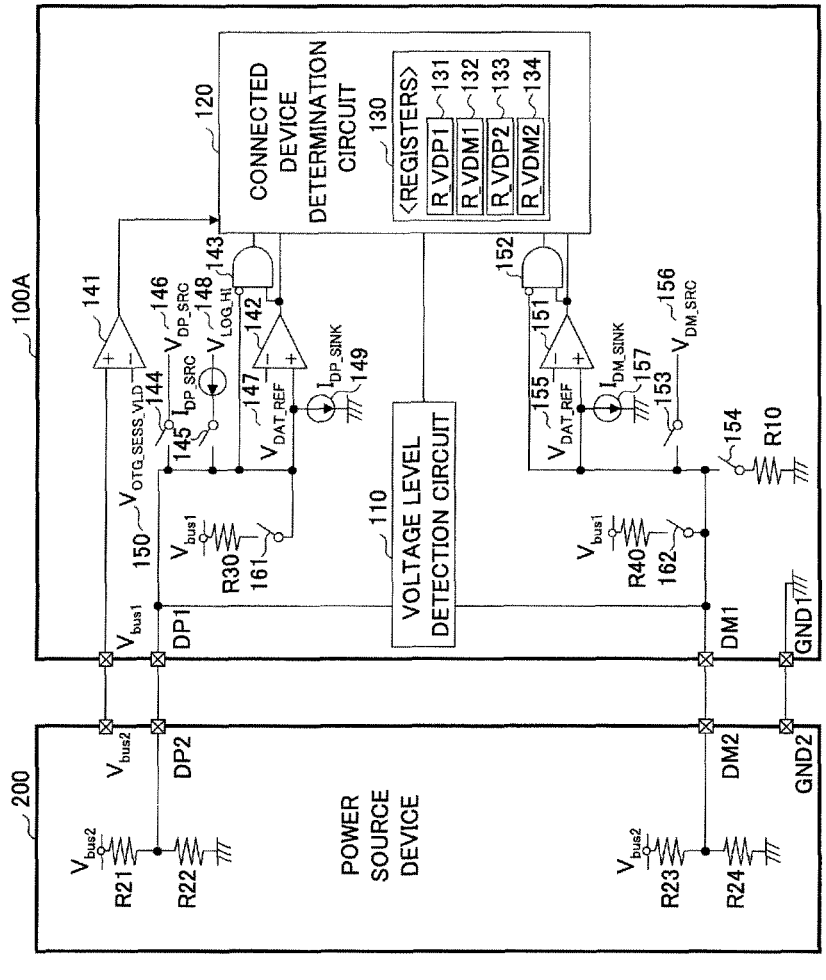
FIG. 7 is a drawing illustrating an electronic device of a second embodiment.

FIG. 7 is a drawing illustrating an electronic device 100A of the second embodiment. The electronic device 100A includes resistors R30 and R40 and switches 161 and 162.

The resistor R30 is connected to the power terminal $V_{bus1}$ at one end, and is connected to one end of the switch 161 at the other end. The other end of the switch 161 is connected to the data terminal DP1, the current source 149, a non-inverting input terminal of the comparator circuit 142, etc. The resistor R30 is a pull-up resistor of the data terminal DP1.

The resistor R40 is connected to the power terminal $V_{bus1}$ at one end, and is connected to one end of the switch 162 at the other end. The other end of the switch 162 is connected to the data terminal DM1, the current source 157, a non-inverting input terminal of the comparator circuit 151, etc. The resistor R40 is a pull-up resistor of the data terminal DM1.

Figure 8:
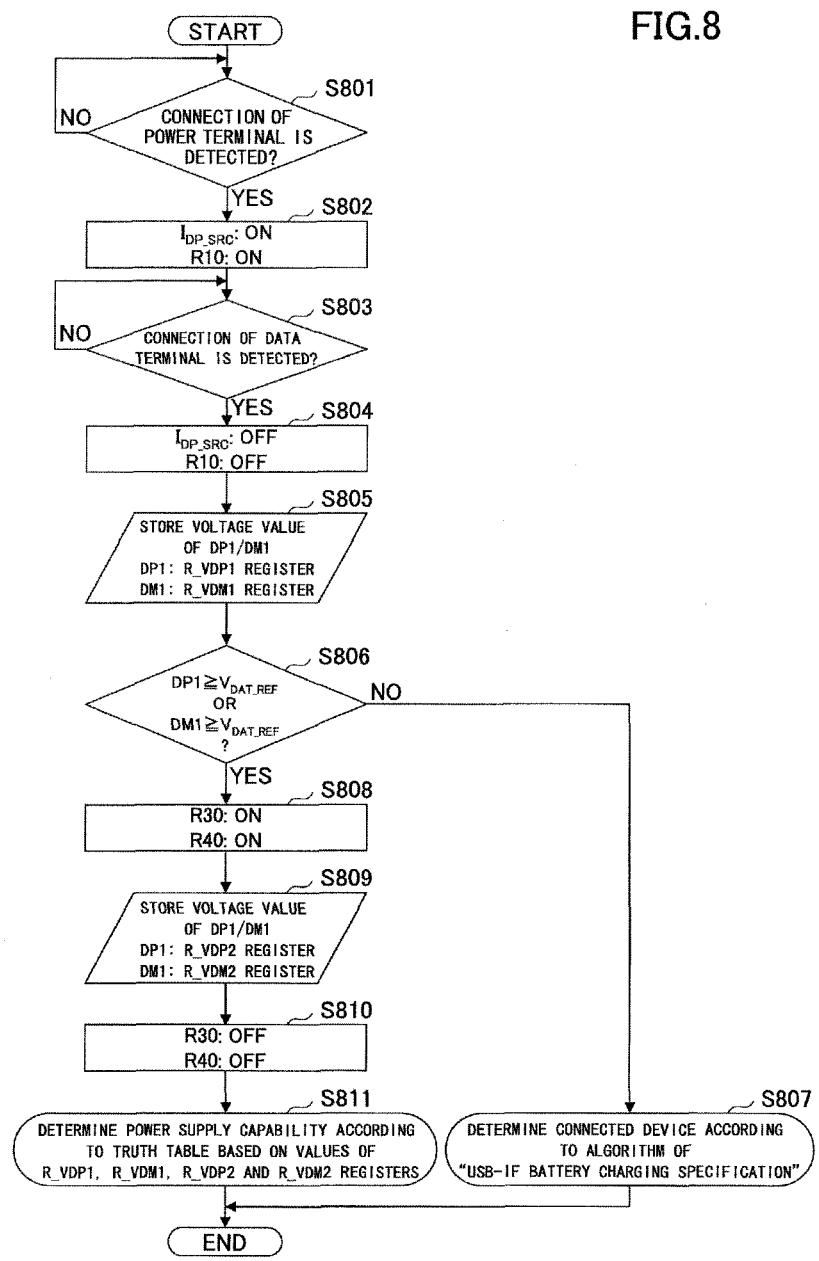
FIG. 8 is a flowchart illustrating operations of the electronic device of the second embodiment.

In the following, referring to FIG. 8, operations of the electronic device 100A of the present embodiment will be described. FIG. 8 is a flowchart illustrating operations of the electronic device 100A.

Processes from step S801 through S806 in FIG. 8 are the same as the processes from step S201 through S206, and the description is omitted.

The connected device determination circuit 120 of the electronic device 100A causes the switches 161 and 162 to be ON, causes the resistor R30 to be connected to the data terminal DP1, and causes the resistor R40 to be connected to the data terminal DM1 (step S808).

Then, the voltage level detection circuit 110 stores the detected voltage values in the registers 130 (step S809). To be more precise, the voltage level of the data terminal DP1 is stored in the R_VDP2 register 133, and the voltage level of the data terminal DM1 is stored in the R_VDM2 register 134.

Then, the connected device determination circuit 120 causes the switches 161 and 162 to be OFF (step S810). Then, the electronic device 100A determines the power supply capability of the power source device 200 (step S811).

In the following, determination of the power supply capability by the electronic device 100A will be described. In the present embodiment, there are two methods for determining the power supply capability of the power source device 200.

The first method is a method in which resistances of a pull-up resistor and a pull-down resistor connected to the data terminal DP1 and the data terminal DM1 are calculated based on the values stored in the registers 130, and the result of calculation is compared with a truth table.

In the present embodiment, in order to obtain resistor values, a system of equations of the pull-up resistor and the pull-down resistor of the data lines DP2 and DM2 are established and solved. In the electronic device 100A, the system of equations includes an equation for a state in which voltage and current are not applied and an equation for a state in which the current is applied to the data terminal DP1 and the pull-down resistor R10 is connected to the data terminal DM1.

In the present embodiment, theoretical values of the R_VDP1 register 131 and the R_VDP2 register 133 (VDP1 and VDP2) are determined by the following formula 9 and formula 10.

⟨Math 9⟩

$$VDP1 = \frac{V_{bus2} \times R_{22}}{R_{21} + R_{22}} \qquad \text{formula 9}$$

⟨Math 10⟩

$$VDP2 = \frac{V_{bus2} \times R22}{(R21 // R30) + R22} \qquad \text{formula 10}$$

In the present embodiment, by solving these formulas as a system of equations, a resistor value of the resistor R21, which is a pull-up resistor of the internal data terminal DP2 of the power source device 200, and a resistor value of the resistor R22, which is a pull-down resistor, can be obtained. The resistor R21 and the resistor R22 values can be obtained by the following formula 11 and formula 12.

⟨Math 11⟩

$$R21 = \frac{R30 \times V_{bus2}(VDP1 - VDP2)}{VDP1(VDP2 - V_{bus2})} \quad \text{formula 11}$$

⟨Math 12⟩

$$R22 = \frac{R30 \times V_{bus2}(VDP1 - VDP2)}{(V_{bus2} - VDP1)(VDP2 - V_{bus2})} \quad \text{formula 12}$$

Likewise, in the present embodiment, theoretical values of the R_VDM1 register 132 and the R_VDM2 register 134 (VDM1 and VDM2) are determined by the following formula 13 and formula 14.

⟨Math 13⟩

$$VDM1 = \frac{V_{bus2} \times R24}{R23 + R24} \quad \text{formula 13}$$

⟨Math 14⟩

$$VDM2 = \frac{V_{bus2} \times R24}{(R23 \,//\, R40) + R24} \quad \text{formula 14}$$

In the present embodiment, by solving these formulas as a system of equations, a resistor value of the resistor R23, which is a pull-up resistor of the internal data terminal DM2 of the power source device 200, and a resistor value of the resistor R24, which is a pull-down resistor, can be obtained. The resistor R23 and the resistor R24 can be obtained by the following formula 15 and formula 16.

⟨Math 15⟩

$$R23 = \frac{R40 \times V_{bus2}(VDM1 - VDM2)}{VDM1(VDM2 - V_{bus2})} \quad \text{formula 15}$$

⟨Math 16⟩

$$R24 = \frac{R40 \times V_{bus2}(VDM1 - VDM2)}{(V_{bus2} - VDM1)(VDM2 - V_{bus2})} \quad \text{formula 16}$$

The connected device determination circuit 120, using the resistor values obtained as described above, and comparing them with, for example, the capability determination table 30, determines the power supply capability.

In the following, the second method for determining the power supply capability of the power source device 200 will be described. In the present embodiment, the second method is a method for determining the power supply capability in the case where the resistor value of the pull-up resistor of the connected power source device 200 and the resistor value of the pull-down resistor are known.

FIG. 9 is a drawing illustrating a first example of a capability determination table 90 of the second embodiment. In the capability determination table 90 shown in FIG. 9, a case is shown in which the pull-up resistor and the pull-down resistor are replaced by voltage values of the data terminals. Also, in the capability determination table 90 shown in FIG. 9, it is assumed that, for example, the power terminal $V_{bus1}$=5.0 V, a resistor value of the resistor R30=100 kΩ, and a resistor value of the resistor R40=100 kΩ. The capability determination table 90 shown in FIG. 9 is a capability determination table in which resistor values of the capability determination table 30 shown in FIG. 3 are replaced by voltage values. In order to determine the capabilities of the power source devices 1 through 5 using the capability determination table 90, one only has to determine whether the voltage values of the data lines are higher or lower compared to, for example, four threshold values (0.6 V, 1.7 V, 2.3 V and 3.0 V) and to store the determination results in the registers 130.

FIG. 10 is a drawing illustrating registers in which determination results of the voltage values in the second embodiment are stored. Taking an error of +/−0.1 V of the detected voltage value into account, expected register values become as shown in FIG. 11.

FIG. 11 is a drawing illustrating a second example of the capability determination table of the second embodiment. In the capability determination table 95 shown in FIG. 11, register values are associated with the power supply capability. Also, in the capability determination table 95 shown in FIG. 11, a name of the power source device is associated with the values stored in the registers 130 and the power supply capability. The electronic device 100A can determine the power supply capability of the power source device 200 based on the values stored in the registers 130 in step S805 and step S809 and the capability determination table 95.

The present invention is described above according to the embodiments, but the present invention is not limited to the requirements shown in the above embodiments. These requirements may be modified without departing from the spirit of the present invention, and can be defined according to the applied embodiments.

The present application is based on and claims the benefit of priority of Japanese Priority Application No. 2012-199137 filed on Sep. 11, 2012 with the Japanese Patent Office, the entire contents of which are hereby incorporated by reference.

What is claimed is:

1. An electronic device for being connected to a power source device and including a power terminal, a ground terminal and a plurality of data terminals, the electronic device comprising:
    a current source for applying current,
    a voltage level detection circuit configured to detect voltage values of the plurality of data terminals,
    a resistor value detection circuit configured to detect a resistor value of a pull-up resistor or pull-down resistor configured to be connected to one of the plurality of data terminals in the power source device, and
    a connected device determination circuit configured to determine a type of the power source device based on the voltage values of the plurality of data terminals detected by the voltage level detection circuit and the resistor value detected by the resistor value detection circuit.

2. The electronic device as claimed in claim 1, wherein the connected device determination circuit determines whether the plurality of data terminals are driven or not based on the voltage values of the plurality of data terminals detected by the voltage level detection circuit, and determines the type of the power source device based on a result of the determination.

3. The electronic device as claimed in claim 2, further comprising:
    a switch configured to cause the current source for applying current, the pull-up resistor or the pull-down resistor to be connected to one of the plurality of data terminals, wherein the connected device determination circuit causes the switch to be ON to cause the voltage level detection circuit to detect the voltage values of the plurality of data terminals when any one of the voltage values of the plurality of data terminals is greater than a predefined voltage when the switch is caused to be OFF, and determines the type of the power source device based on the voltage values of the plurality of data terminals when the switch is caused to be OFF and the voltage values of the plurality of data terminals when the switch is caused to be ON.

4. The electronic device as claimed in claim 3, wherein the connected device determination circuit includes
- registers in which the voltage values of the plurality of data terminals when the switch is caused to be OFF and the voltage values of the plurality of data terminals when the switch is caused to be ON are stored, and
- a table in which resistor values of pull-up resisters or pull-down resistors that are connected to the plurality of data terminals in the power source device, the value being calculated from the voltage values stored in the registers, are associated with a power supply capability of the power source device, and determines the power supply capability of the power source device by referring to the values stored in the registers and the table.

5. A method of an electronic device to be connected to a power source device, for determining a type of the power source device, the electronic device including a power terminal, a ground terminal, a plurality of data terminals, a current source for applying current, a pull-up resistor or a pull-down resistor that is connected to one of the plurality of data terminals, the method for determining the type of the power source device comprising:
- detecting voltage values of the plurality of data terminals,
- detecting a resistor value of the pull-up resistor or pull-down resistor that is connected to said one of the plurality of data terminals in the power source device, and
- determining the type of the connected power source device based on the detected voltage values of the plurality of data terminals and the detected resistor value of the pull-up resistor or pull-down resistor.

* * * * *